(12) United States Patent
Kobilka et al.

(10) Patent No.: US 9,831,434 B1
(45) Date of Patent: Nov. 28, 2017

(54) FUNCTIONALIZED PYRANOPYRAN-DERIVED ACCEPTORS FOR DONOR-ACCEPTOR POLYMERS

(71) Applicant: International Business Machines Corporation, Armonk, NY (US)

(72) Inventors: Brandon M. Kobilka, Tucson, AZ (US); Jason T. Wertz, Pleasant Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/189,555

(22) Filed: Jun. 22, 2016

(51) Int. Cl.
*H01L 51/00* (2006.01)
*C08G 61/12* (2006.01)
*H01L 51/42* (2006.01)

(52) U.S. Cl.
CPC ........ *H01L 51/0036* (2013.01); *C08G 61/126* (2013.01); *H01L 51/0043* (2013.01); *H01L 51/4253* (2013.01); *C08G 2261/314* (2013.01); *C08G 2261/3221* (2013.01); *C08G 2261/3222* (2013.01); *C08G 2261/3223* (2013.01); *C08G 2261/3225* (2013.01); *C08G 2261/3241* (2013.01); *C08G 2261/3243* (2013.01); *C08G 2261/411* (2013.01); *C08G 2261/414* (2013.01); *C08G 2261/415* (2013.01); *C08G 2261/514* (2013.01); *C08G 2261/91* (2013.01)

(58) Field of Classification Search
CPC .................................................. H01L 51/0036
USPC ........................................................ 549/238
See application file for complete search history.

(56) References Cited

U.S. PATENT DOCUMENTS 9,087,991 B2 7/2015 Kuhn et al.
9,219,233 B2 12/2015 Facchetti et al.
2012/0279566 A1 11/2012 Bruder et al.
2013/0150552 A1 6/2013 Amb et al.
2015/0349257 A1 12/2015 Li et al.

FOREIGN PATENT DOCUMENTS

JP 5857743 B2 2/2016
WO 2015178115 A1 11/2015

OTHER PUBLICATIONS

Bernede, et al., "Improvement of the efficiency of organic solar cells using the terthiophene-pyran-malononitrile (T3PM) as electron donor, through the use of a MoO3/CuI anode buffer layer", E-MRS 2011, Energy Procedia, vol. 31, 2012, 8 pp.
Zhang, et al., "Triphenylamine-containing D-A-D molecules with (dicyanomethylene) pyran as an acceptor unit for bulk-heterojunction organic solar cells", Journal of Materials Chemistry, Issue 11, 2011 (Abstract Only).
El-Shishtawy, et al., "Pyran-Squaraine as Photosensitizers for Dye-Sensitized Solar Cells" DFT/TDDFT Study of the Electronic Structures and Absorption Properties, International Journal of Photoenergy, vol. 2014, 7 pp.
Awuah, et al., "New Pyran Dyes for Dye-Sensitized Solar Cells", Journal of Photochemistry and Photobiology A: Chemistry vol. 224, Issue 1, Nov. 15, 2011, pp. 116-122.
Kularatne, et al., "Donor-Acceptor Semiconducting Polymers for Organic Solar Cells", Journal of Polymer Science, Part A: Polymer Chemistry 2013, vol. 51, pp. 743-768.
Franco, et al., "New D-π-A-Conjugated Organic Sensitizers Based on 4H-Pyran-4-ylidene Donors for Highly Efficient Dye-Sensitized Solar Cells", Organic Letters 2012, vol. 14, No. 3, pp. 752-755.

*Primary Examiner* — Taofiq A Solola
(74) *Attorney, Agent, or Firm* — Patterson + Sheridan, LLP (57) ABSTRACT

An organic photovoltaic device includes an anode and a cathode. The organic photovoltaic device includes an active layer between the anode and the cathode. The active layer includes a p-type material. The p-type material includes a donor-acceptor (DA) polymer. An acceptor unit of the DA polymer includes a functionalized pyranopyran-dione compound or a functionalized naphthyridine-dione compound.

10 Claims, 7 Drawing Sheets

FUNCTIONALIZED PYRANOPYRAN-DERIVED ACCEPTORS FOR DONOR-ACCEPTOR POLYMERS

I. FIELD OF THE DISCLOSURE

The present disclosure relates generally to a functionalized pyranopyran-derived acceptor of a donor-acceptor (DA) polymer.

II. BACKGROUND

A need for energy has placed an emphasis on obtaining energy from renewable sources. Organic photovoltaic devices may offer a practical path to achieve low-cost, renewable energy by converting light to electricity. One component of an organic photovoltaic device may be a p-type material. The p-type material may be a donor-acceptor polymer that includes a plurality of alternating electron-rich (donor) units and electron-deficient (acceptor) units. A solar cell may be formed by appropriately coupling the donor-acceptor polymer with an n-type material, an anode, and a cathode. For example, the donor-acceptor polymer may be coupled with the n-type material as a bulk heterojunction between the anode and the cathode.

A donor-acceptor polymer may have a high degree of conjugation and may have a high degree of crystallinity to enable charge separation and transport. The donor-acceptor polymer may also have one or more alkyl side chains covalently coupled to a backbone of the donor-acceptor polymer to improve solubility of the donor-acceptor polymer and enable solution processing into large area films. The backbone of the polymer may include one or more fused ring structures to promote planarity of the donor-acceptor polymer.

III. SUMMARY OF THE DISCLOSURE

Functionalized pyranopyran-derived acceptors of DA polymers possess two fused unsaturated rings, which may increase planarity and conjugation of the DA polymers. The functionalized pyranopyran-derived acceptors also include two lactones, which may improve electron-deficient characteristics of the DA polymers. The functionalized pyranopyran-derived acceptors possess numerous reactive sites that may be functionalized further with particular groups to provide particular backbone structures to the DA polymers produced with the functionalized pyranopyran-derived acceptors and to provide particular side chains extending from the DA polymers. The particular backbone structures may provide beneficial electronic and crystalline properties to the DA polymers, and the particular side chains may enable solution processing of the DA polymers. Additionally, the functionalized pyranopyran-derived acceptors may be produced using a bio-renewable starting source.

According to an embodiment, a DA polymer includes a sequence of where D is an electron-rich donor unit, A is an electron-deficient acceptor unit, and n is an integer between 4 and 200,000. The acceptor unit includes a functionalized pyranopyran-dione unit or a functionalized naphthyridine-dione unit.

According to another embodiment, an organic photovoltaic device includes an anode and a cathode. The organic photovoltaic device includes an active layer between the anode and the cathode. The active layer includes a p-type material. The p-type material includes a donor-acceptor (DA) polymer. An acceptor unit of the DA polymer includes a functionalized pyranopyran-dione compound or a functionalized naphthyridine-dione compound.

According to another embodiment, a method includes reacting diethyl acetylene dicarboxylate or dimethyl acetylene dicarboxylate with iodine and hydrogen peroxide to yield a fumarate. The method includes reacting the fumarate with alkynyl compounds including heterocyclic groups to produce a bis-alkynylfumarate. The method includes subjecting the bis-alkynylfumarate to iodocyclization conditions to produce a functionalized diiodopyranopyran-dione. The method includes replacing the iodines of the functionalized diiodopyranopyran-dione with other functional groups. The method also includes adding reagents to perform cross-coupling reactions to couple moieties to the heterocyclic groups to produce functionalized pyranopyran-dione monomer.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

V. DETAILED DESCRIPTION

The present disclosure describes functionalized pyranopyran-derived acceptors for DA polymers. The DA polymers may have the general formula:

where D are electron-rich donor units, A are electron-poor acceptor units, and n is an integer between 4 and 200,000. The electron-rich donor units may include dialkyl fluorene carbazole cyclopentadithiophene dithienosilole benzodithiophene benzodifuran thiophenes (e.g., bithophene, terthiophene, quaterthiophene, etc.), furans, selenophene, or other donor units, where R is a linear or branched compound having from 1 to 40 carbons (e.g., an alkyl group, an alkenyl group, an alkynyl group, an aryl group, an alkoxy group, an alkylamino group, a carbonyl group, other functional group, or combinations thereof). The electron-poor acceptor units may include functionalized pyranopyran-dione units or functionalized naphthyridine-dione units. The DA polymers may be utilized as p-type material for organic electronic devices such as organic solar cells.

The functionalized pyranopyran-derived acceptors may be units from functionalized pyranopyran-dione monomers or functionalized naphthyridine-dione monomers. The functionalized pyranopyran-dione monomers may have the formula:

where $R_1$ is an unsaturated heterocyclic group and $R_2$ is hydrogen (H), fluorine (F), another halogen, or a linear or branched compound having from 2 to 40 carbons (e.g., an alkyl group, an alkenyl group, an alkynyl group, an aryl group, an alkoxy group, an alkylamino group, a carbonyl group, other functional group, or combinations thereof).

In particular embodiments, the unsaturated heterocyclic group $R_1$ has the formula:

where X is oxygen, sulfur, selenium, nitrogen, or other element with beneficial properties when used in organic semiconducting materials, where $R_3$ is hydrogen or a linear or branched compound having from 1 to 40 carbons (e.g., an alkyl group, an alkenyl group, an alkynyl group, an aryl group, an alkoxy group, an alkylamino group, a carbonyl group, other functional group, or combinations thereof), and $R_4$ is independently selected from hydrogen or a linear or branched compound having from 1 to 40 carbons (e.g., an alkyl group, an aryl group, an alkenyl group, an alkynyl group, an aryl group, an alkoxy group, an alkylamino group, a carbonyl group, other functional group, or combinations thereof). The bromine may be a cross-coupling moiety that enables $R_1$, and the other portions of the functionalized pyranopyran-dione compound, to be coupled to a donor monomer by a Stille cross-coupling reaction or by a Suzuki cross-coupling reaction. In other embodiments, the bromine may be replaced by a different functional group that enables a cross-coupling reaction with a donor monomer.

In some embodiments, the functionalized pyranopyran-dione compound may be reacted with an amine (e.g., $H_2NR_5$) to yield a functionalized naphthyridine-dione compound. The functionalized naphthyridine-dione compound may have the general formula:

Functionalized pyranopyran-dione monomers and functionalized naphthyridine-dione monomers include two fused-rings, which may increase planarity and conjugation of DA polymers produced with the functionalized pyranopyran-dione monomers and the functionalized naphthyridine-dione monomers. The diones in the functionalized pyranopyran-dione monomers and the functionalized naphthyridine-dione monomers may improve electron-deficient characteristics of the acceptors of the DA polymers produced from the monomers as compared to similar acceptors of DA polymers produced from polymers without diones. The functionalized pyranopyran-dione monomers and functionalized naphthyridine-dione monomers may have a number of different functional groups (i.e., $R_1$, $R_2$, and $R_5$) that enable tuning of electronic properties, crystalline properties, solubility properties, or combinations thereof, of DA polymers produced from the functionalized pyranopyran-dione monomers and functionalized naphthyridine-dione monomers.

Figure 1:
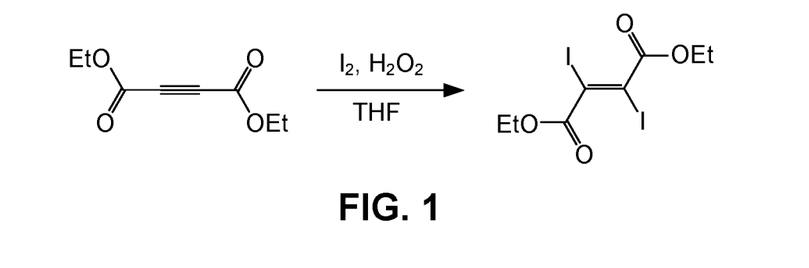
FIG. 1 is a chemical reaction diagram of a first portion of a process of forming a functionalized pyranopyran-derived acceptor for a DA polymer.

FIGS. 1-8 depict synthetic pathways to functionalized pyranopyran-dione monomers and functionalized naphthyridine-dione monomers. FIG. 1 depicts a chemical reaction of diethyl acetylene dicarboxylate in tetrahydrofuran (THF) with iodine ($I_2$) and hydrogen peroxide ($H_2O_2$) to yield trans-ethyldiidofumarate. Residual iodine may be quenched with a sodium metabisulfite ($Na_2S_2O_5$) solution. The reaction products may be washed with water and brine, dried over magnesium sulfate ($MgSO_4$), filtered, and concentrated to produce a residue. The residue may be purified by silica-gel chromatography using an ethyl acetate-hexane mixture as an eluent, or by other purification techniques.

The diethyl acetylene dicarboxylate may be derived from succinic acid, a bio-derived and renewable resource. Alternately, dimethyl acetylene dicarboxylate may be used as a reactant instead of diethyl acetylene dicarboxylate.

Figure 2:
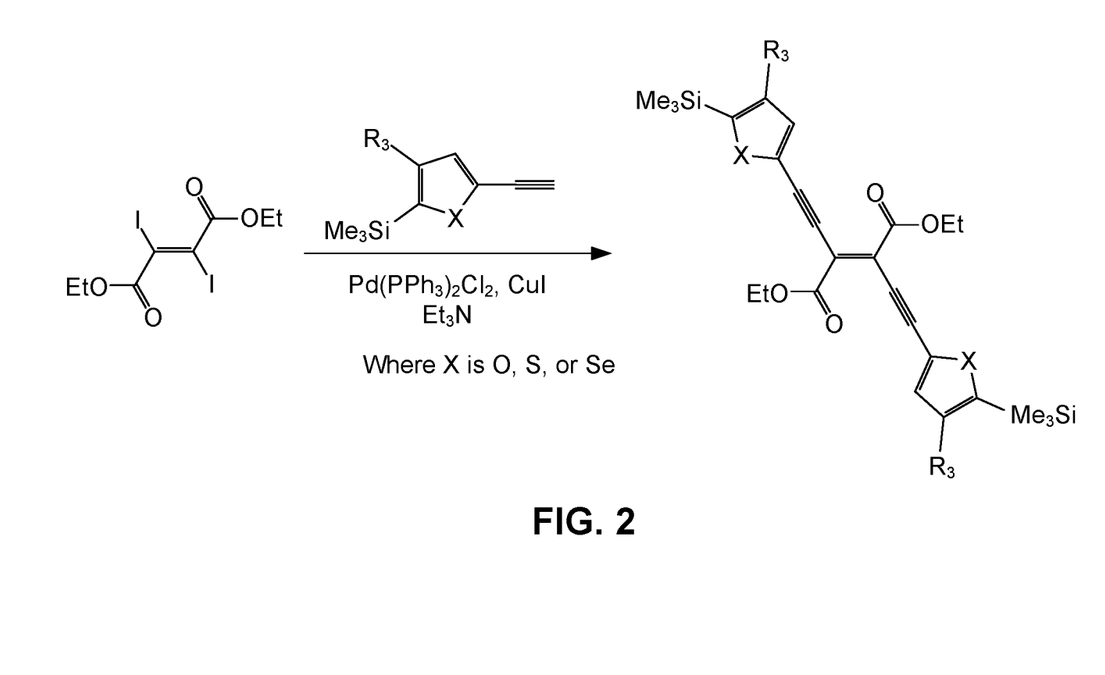
FIG. 2 is a chemical reaction diagram of a second portion of the process of forming the functionalized pyranopyran-derived acceptor for the DA polymer.

FIG. 2 depicts a chemical reaction of the trans-diethyldiidofumarate with heterocyclic alkyne groups using Sonogashira coupling to yield a bis-alkynylfumarate. The heterocyclic alkyne groups may be:

where the five member unsaturated heterocyclic ring is one of furan, thiophene, and selenophene. A carbon of the unsaturated heterocyclic ring may be coupled to a trimethyl silane group ($Me_3Si$). The $Me_3Si$ group may be protective group that is subsequently substituted for a cross-coupling moiety to facilitate cross coupling with a D monomer during polymerization to produce the DA polymer. In other embodiments, other alkylsilyl or alkylarylsilyl groups (e.g., a triethyl silane group (TES), a tributyl silane group (TBS), a tert-butyldimethyl silane (TBDMS), a triphenyl silane (TPS), a tert-butyl, triisopropylsilyl ether group, etc.) may be utilized. The Sonogashira cross-coupling may be conducted in the presence of bis(triphenylphosphine)palladium (II) dichloride ($Pd(PPh_3)_2Cl_2$), copper iodide (CuI), and triethylamine ($Et_3N$). In other embodiments, other catalysts, other solvents (e.g., dimethylformamide (DMF), dichloromethane (DCM), THF, etc.), or combinations thereof, may be used. After reaction completion, solvent (e.g., $Et_3N$, other solvents, or both) may be removed using reduced pressure. A resulting slurry may be purified utilizing aqueous workup conditions or filtration conditions to produce a crude product. The crude product may be purified by recrystallization, column chromatography, or other techniques.

Figure 3:
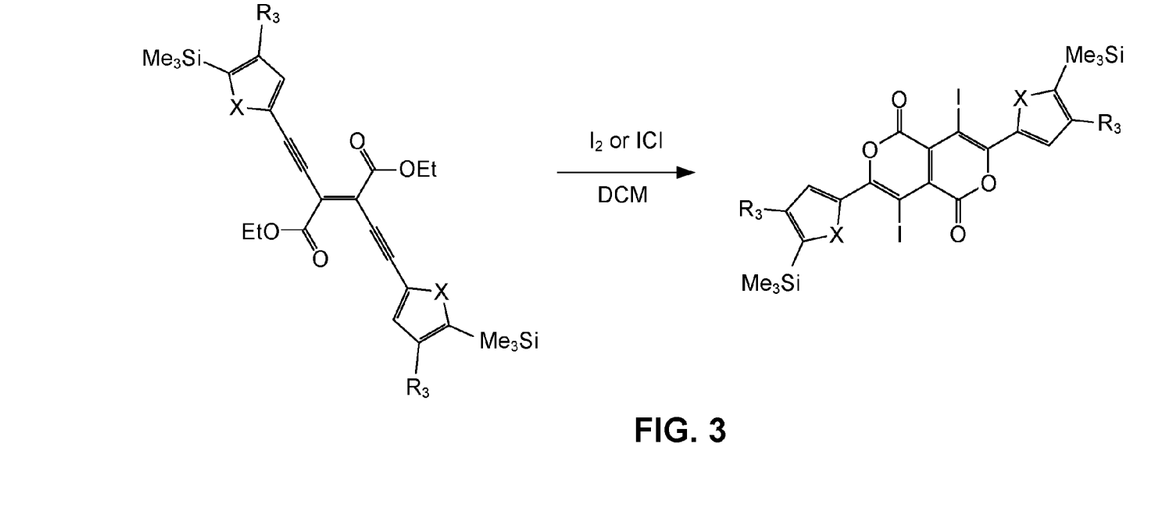
FIG. 3 is a chemical reaction diagram of a third portion of the process of forming the functionalized pyranopyran-derived acceptor for the DA polymer.

FIG. 3 depicts a cyclization reaction of the bis-alkynylfumarate derivative produced by the reaction depicted in FIG. 2. The bis-alkynylfumarate derivative in dichloromethane (DCM) or other suitable solvent (e.g., chloroform or chlorobenzene) may be subjected to iodocyclization conditions with iodine monochloride (ICl), iodine ($I_2$), or both, in a solvent (e.g., DCM, chloroform, hexane, etc.) to produce a bis-heterocyclic functionalized diiodopyranopyran dione compound. Residual iodine may be quenched with a sodium metabisulfite ($Na_2S_2O_5$) solution. A reaction mixture may be washed with water and brine, dried over $MgSO_4$, filtered, and concentrated as a second residue. The second residue may be purified by silica-gel chromatography using an ethyl acetate-hexane mixture as an eluent, or by other purification techniques.

Figure 4:
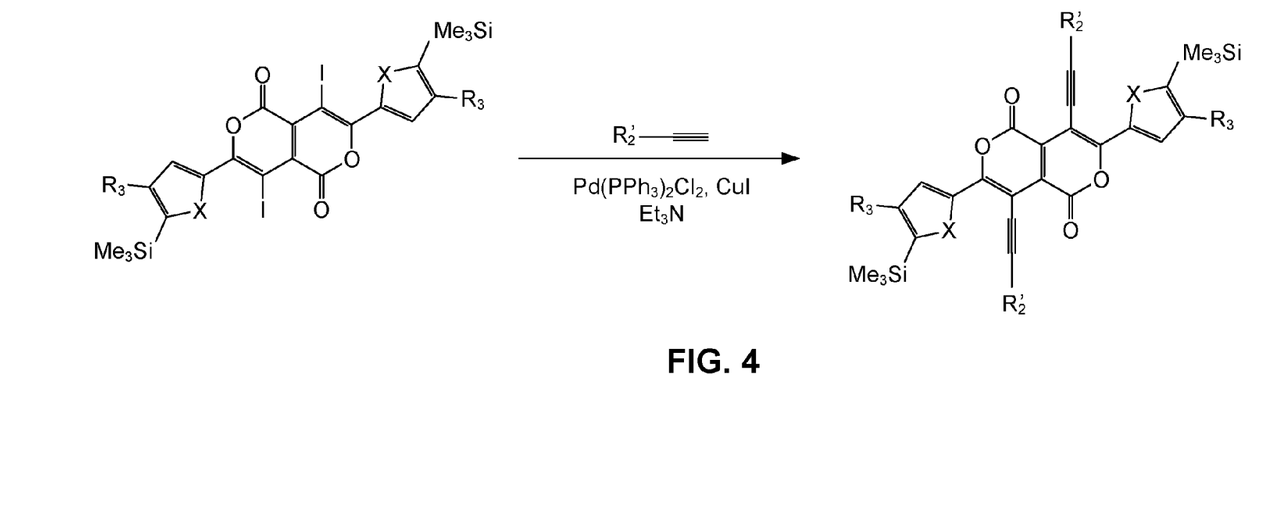
FIG. 4 is a chemical reaction diagram of a fourth portion of the process of forming a first functionalized pyranopyran-derived acceptor for the DA polymer.

As depicted in FIG. 4, the iodides of the bis-heterocyclic functionalized diiodopyranopyran dione compound may be replaced by Sonogashira cross-coupling reaction with:

to yield an alkynyl compound. $R_2'$ may be a linear or branched alkyl group having 1 to 38 carbons or a linear or branched arylalkyl group having 6 to 38 carbons. In addition to, or in lieu of, being an alkyl group or an arylalkyl group, $R_2'$ may include an alkenyl group, an alkoxy group, an alkylamino group, a carbonyl group, other functional group, or combinations thereof. After reaction completion, solvent (e.g., $Et_3N$, other solvents, or both) may be removed using reduced pressure. A resulting slurry may be purified utilizing aqueous workup conditions or filtration conditions to produce a crude product. The crude product may be purified by recrystallization, column chromatography, or other techniques.

Figure 5:
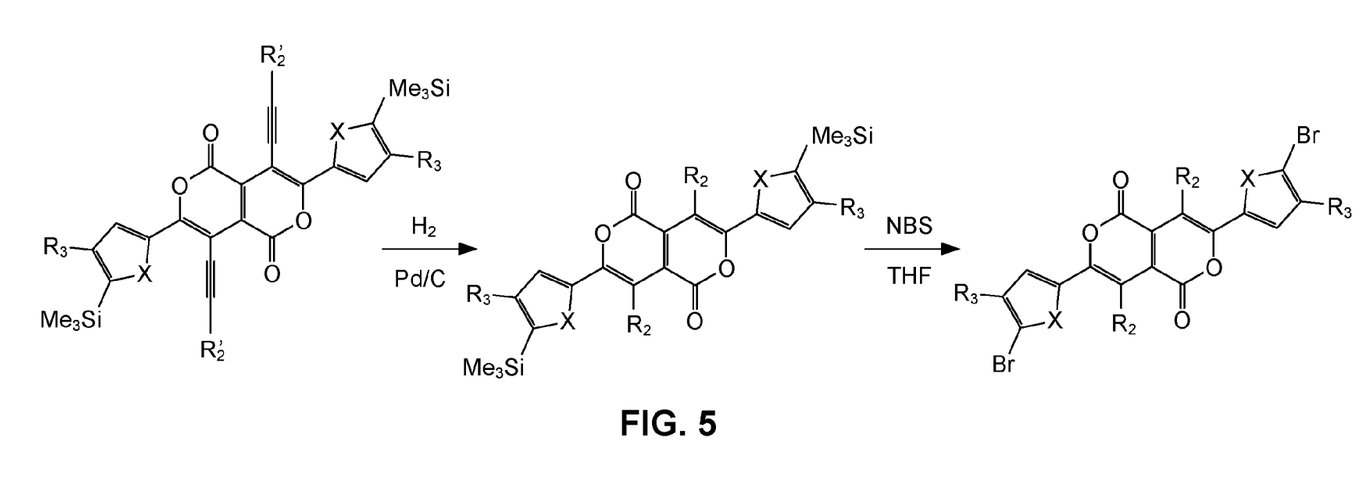
FIG. 5 is a chemical reaction diagram of a fifth portion of the process of forming the first functionalized pyranopyran-derived acceptor for the DA polymer.

FIG. 5 depicts reactions that yield a first functionalized pyranopyran-dione monomer (i.e., an acceptor monomer). In a first reaction, hydrogen (H$_2$) in the presence of a palladium on carbon catalyst (Pd/C) is used to hydrogenate the triple bonds of the alkynyl group of the bis-heterocyclic functionalized diiodopyranopyran dione compound in a solvent (e.g., ethanol; ethanol and one or more of THF, DCM, chloroform, dioxane, etc., other solvents, or combinations thereof). Upon reaction completion, a resulting mixture may be filtered to remove the Pd/C and rinsed with an organic solvent (e.g., THF, DCM, etc.), and the solvents may be removed by reduced pressure. A resulting solid may be purified via filtration, column chromatography, distillation, or other technique.

In other embodiments, the bis-heterocyclic functionalized diiodopyranopyran dione compound is not hydrogenated. R$_2$ in FIG. 5 represents R$_2$' plus two additional carbons from the alkynal group (i.e., a linear or branched group having from 2 to 40 carbons).

Figure 6:
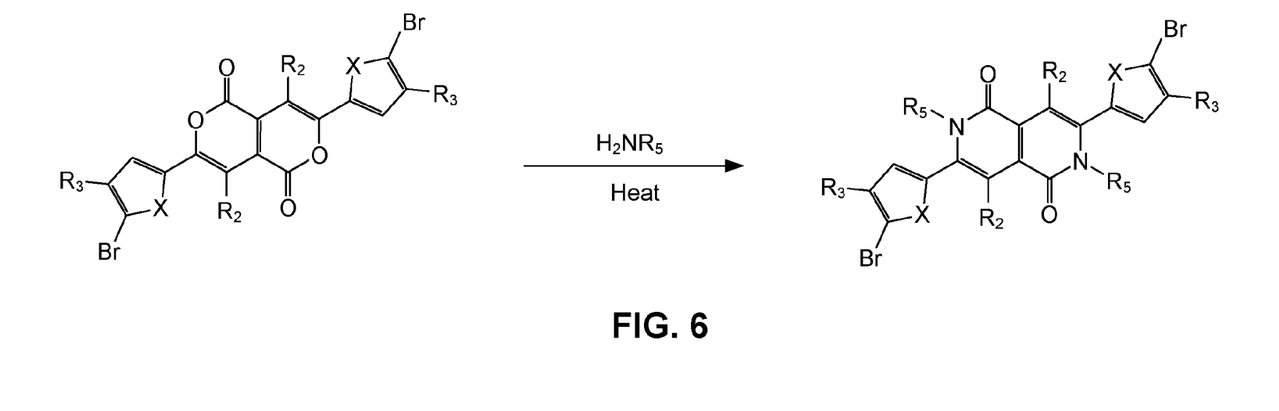
FIG. 6 is a chemical reaction diagram of a sixth portion of the process of forming a second functionalized pyranopyran-derived acceptor for the DA polymer.

In a second reaction, the Me$_3$Si groups of the bis-heterocyclic functionalized diiodopyranopyran dione compound may be replaced with bromine by reaction with N-bromosuccinimide (NBS) in tetrahydrafuran (THF) to yield the first functionalized pyranopyran-dione monomer. In some embodiments, the first functionalized pyranopyran-dione monomer may be further reacted with an amine (H$_2$NR$_5$, where R$_5$ is a linear or branched alkyl group, a linear or branched arylalkyl group, an alkenyl group, an alkynyl group, an alkoxy group, an alkylamino group, a carbonyl group, other functional group, or combinations thereof, having from 1 to 40 carbons) to yield a first functionalized naphthyridine-dione monomer (i.e., an acceptor monomer), as depicted in FIG. 6. The first functionalized pyranopyran-dione monomer or the first functionalized naphthyridine-dione monomer may be polymerized with a donor monomer (e.g., by Stille cross-coupling or Suzuki cross-coupling) to produce a DA polymer.

Figure 7:
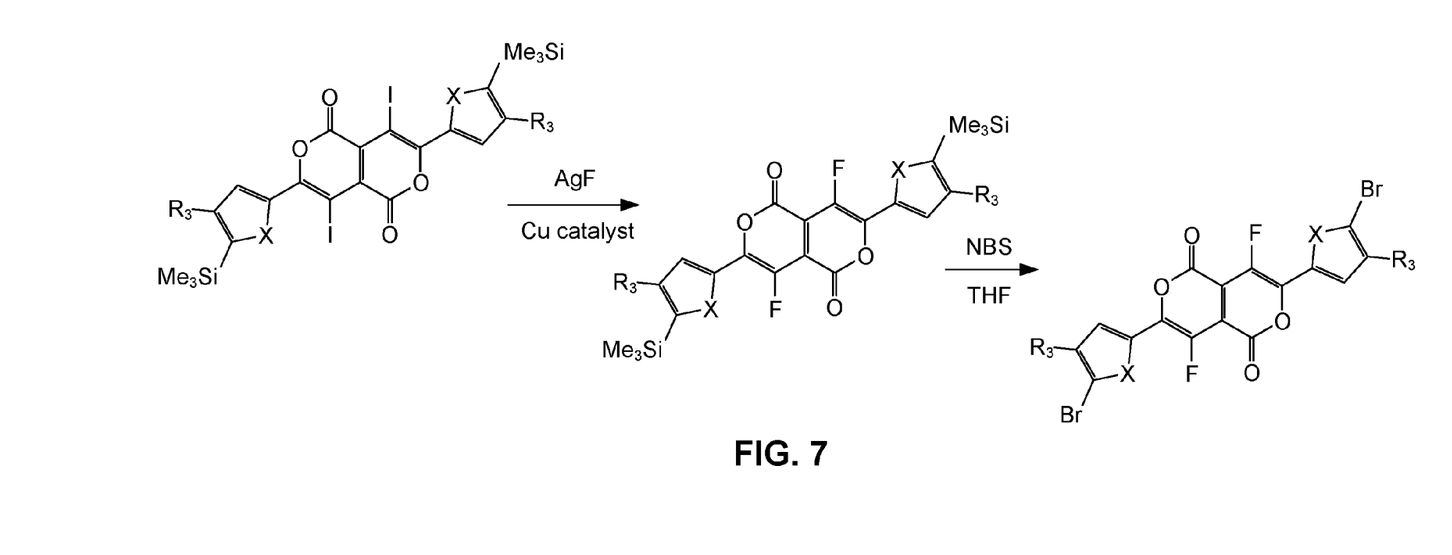
FIG. 7 is a chemical reaction diagram of a fourth portion of the process of forming a third functionalized pyranopyran-derived acceptor for the DA polymer.

As depicted in FIG. 7, silver fluoride (AgF) in the presence of a copper catalyst (Cu catalyst) may be reacted with the bis-heterocyclic functionalized diiodopyranopyran dione compound from FIG. 3 to replace the iodides with fluorides. Cesium fluoride may be added to a reaction mixture. Upon reaction completion, a saturated ammonium chloride solution may be added to the reaction mixture. Resulting layers may be separated and an organic layer may be washed with water and brine, dried over MgSO$_4$, filtered, and concentrated as a third residue. The third residue may be purified by silica-gel chromatography using an ethyl acetate-hexane mixture as an eluent, or by other purification techniques.

Figure 8:
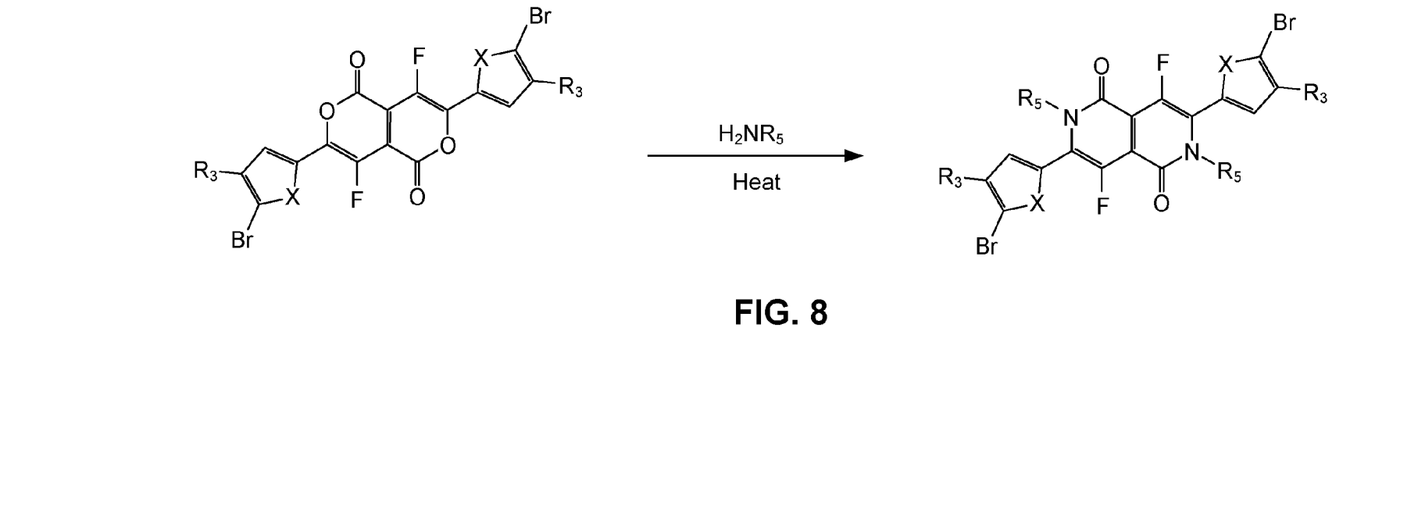
FIG. 8 is a chemical reaction diagram of a fifth portion of the process of forming a fourth functionalized pyranopyran-derived acceptor for the DA polymer.

Me$_3$Si groups of the reaction product may be replaced with bromine by reaction with N-bromosuccinimide in tetrahydrafuran (THF) to yield a second functionalized pyranopyran-dione monomer (i.e., an acceptor monomer). In some embodiments, the second functionalized pyranopyran-dione compound may be further reacted with the H$_2$NR$_3$ to yield a second functionalized naphthyridine-dione monomer (i.e., an acceptor monomer), as depicted in FIG. 8.

Figure 9:
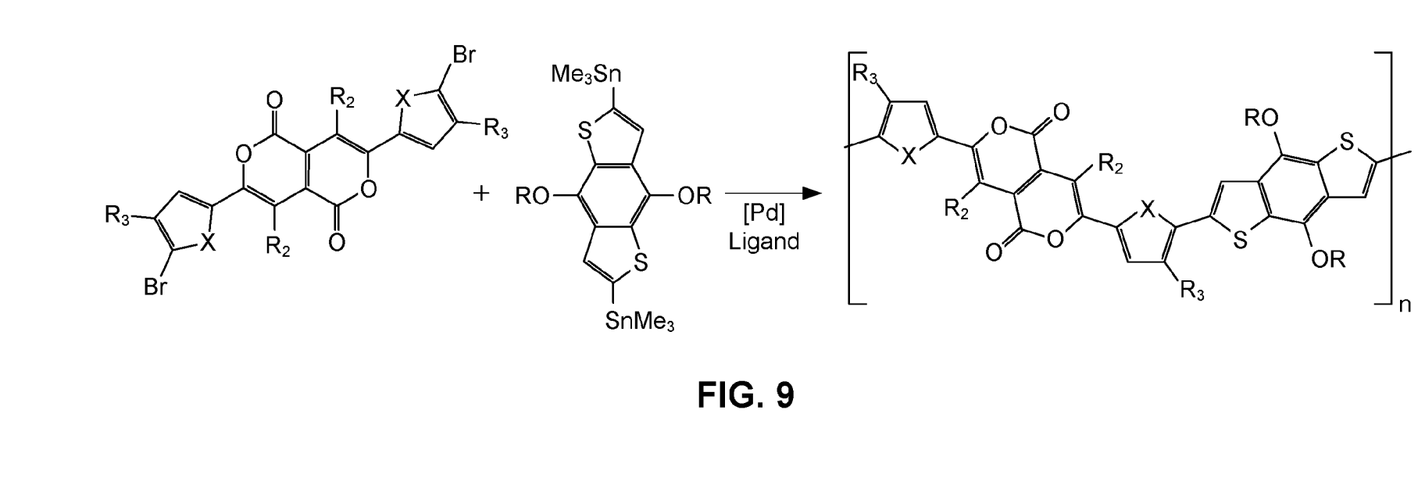
FIG. 9 is a chemical reaction diagram of polymerization of the first functionalized pyranopyran-derived acceptor with a donor.

In another embodiment, the iodides of the bis-heterocyclic functionalized diiodopyranopyran dione compound from FIG. 3 may be replaced by hydrogens using catalytic dehalogenation chemistry, and the Me$_3$Si groups may be replaced with bromine by reaction with NBS in THF to yield a third functionalized pyranopyran-dione monomer (i.e., an acceptor monomer) having the formula:

In some embodiments, the third functionalized pyranopyran-dione compound may be further reacted with the H$_2$NR$_5$ to yield a third functionalized naphthyridine-dione monomer (i.e., an acceptor monomer), having the formula:

A functionalized pyranopyran-dione monomer may be reacted with a donor monomer to produce a DA polymer. FIG. 9 depicts a polymerization reaction of the first functionalized pyranopyran-dione monomer produced by the reaction depicted in FIG. 5 with a benzodithiophene monomer having trimethyltin (Me$_3$Sn) groups. In other embodiments, the trimethyltin groups may be tributyltin or other suitable groups. The reaction may be a Stille cross coupling reaction using a palladium catalyst (e.g., palladium acetate), and may include a ligand such as dibenzylideneacetone (DBA) to give a ligated palladium ([Pd] ligand), such as Pd$_2$DBA$_3$. The reaction may produce a DA polymer with a functionalized pyranopyran-derived acceptor. The reaction may be end-capped by addition of an excess amount of trimethyl(phenyl)tin and iodobenzene. The DA polymer may be precipitated in an organic non-solvent (e.g., methanol, acetone, hexane, etc.), filtered, and purified by Soxhlet extraction, reprecipitation, filtration, column chromatography, another technique, or combinations thereof.

Figure 10:
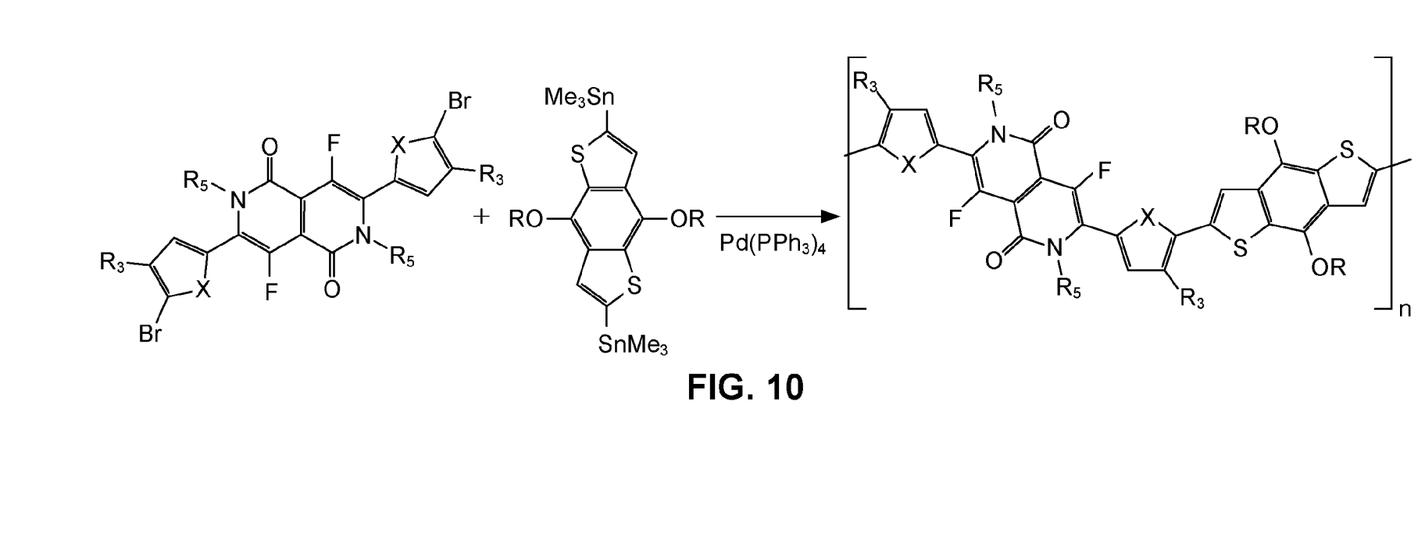
FIG. 10 is a chemical reaction diagram of polymerization of the fourth functionalized pyranopyran-derived acceptor with a donor.

A functionalized naphthyridine-dione monomer may be reacted with a donor monomer to produce a DA polymer. FIG. 10 depicts a polymerization reaction of the second functionalized naphthyridine-dione monomer produced by the reaction depicted in FIG. 8 with the benzodithiophene monomer having trimethyl tin (Me$_3$Sn) groups. The reaction may be a Stille cross coupling reaction using a palladium catalyst (e.g., tetrakis(triphenylphosphine)palladium(0) (Pd (PPh$_3$)$_4$)). The reaction may produce a DA polymer with a functionalized pyranopyran-derived acceptor. The reaction may be end-capped by addition of an excess amount of trimethyl(phenyl)tin and iodobenzene. The DA polymer may be precipitated in an organic non-solvent (e.g., methanol, acetone, hexane, etc.), filtered, and purified by Soxhlet extraction, reprecipitation, filtration, column chromatography, another technique, or combinations thereof.

Thus, FIGS. 1-10 depict synthesis of DA polymers with functionalized pyranopyran-derived acceptors. In other embodiments, the functionalized DA polymers may be synthesized using one or more different reactions in lieu of, or in combination with, one or more of the reactions depicted in FIGS. 1-10. The acceptors may include functionalized pyranopyran-dione units or functionalized naphthyridine-dione units.

Figure 11:
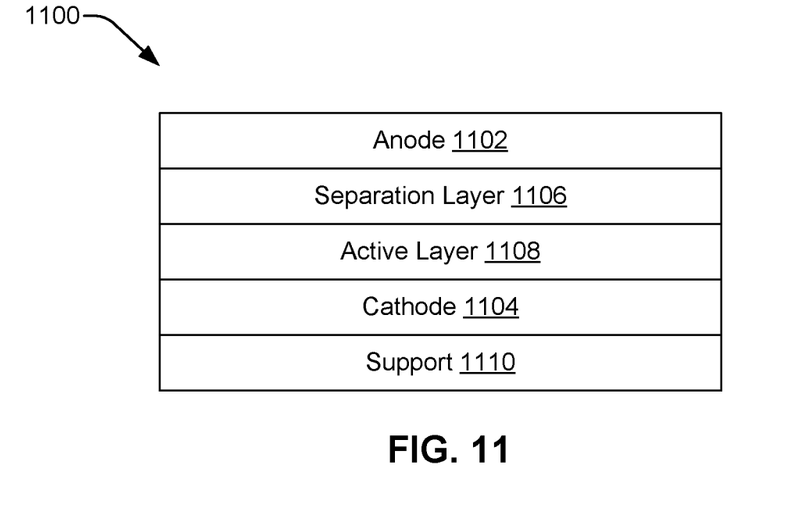
FIG. 11 depicts a block diagram of an organic photovoltaic (OPV) device that includes a DA polymer with a functionalized pyranopyran-derived acceptor.

FIG. 11 depicts a block diagram of an embodiment of an organic photovoltaic (OPV) device 1100. The OPV device 1100 may include an anode 1102, a cathode 1104, a separation layer 1106, an active layer 1108, and a support 1110.

The anode 1102 may include a high work function material (e.g., gold, silver, indium tin oxide (ITO), a conductive polymer, or combinations thereof), and the cathode 1104 may include a low work function metal (e.g., calcium, magnesium, or aluminum) or low work function metal alloy (e.g., lithium fluoride). In an embodiment, the anode 1102 may include a transparent material, such as ITO, and the cathode 1104 may include a metal, such as aluminum.

The separation layer 1106 may be between the anode 1102 and the active layer 1108. The separation layer 1106 may planarize the anode 1102 and may facilitate collection of holes from the active layer 1108 to the anode 1102. The separation layer 1106 may include poly(ethylene dioxythiophene)/polystyrene sulfonic acid (PEDTO/PSS). In other embodiments additional separation layers may be present. For example, a second separation layer may be present between the active layer 1108 and the cathode 1104 or between the cathode 1104 and the support 1110.

The active layer 1108 may include a mixture of a p-type material (i.e., a DA polymer with a functionalized naphthyridine-dione compound or a functionalized pyranopyran-dione compound as the acceptor monomer of the DA polymer) and an n-type material (e.g., [6,6]-phenyl-$C_{61}$-butyric acid methyl ester ($PC_{61}BM$)). The active layer 1108 may have a thickness between about 5 and 150 nanometers. In other embodiments, the p-type material and the n-type material may be formed as separate layers instead of as a bulk heterojunction as depicted in FIG. 11.

Components 1102-1108 may be on the support 1110. The support 1110 may be made of a rigid or flexible material (e.g., a polymer, a metal, glass, or other material). FIG. 11 depicts the cathode 1104 abutting the support layer 1110. In other embodiments, the anode 1102 may be closer to the support layer 1110 than the cathode 1104.

The OPV device 1100 may be prepared by sequentially forming appropriate layers atop one another. Layers may be formed using deposition techniques, printing techniques, solution coating techniques, casting techniques, other techniques, or combinations thereof.

During use, the OPV device 1100 may be exposed to light so that the p-type material of the active layer 1108 absorbs photons and generates excitons. The excitons migrate to an interface between the p-type material and the n-type material. The excitons dissociate at the interface into electrons and holes (i.e., electrons are excited to a lowest unoccupied molecular orbital (LUMO), which leaves holes in a highest occupied molecular orbital). The electrons transfer to the n-type material and are collected at the cathode and the holes are collected at the anode, which enables the OPV to generate an electrical current.

Thus, FIG. 11 depicts an example of an organic electronic device that includes a DA polymer. The organic electronic device may be the OPV device 1100 that is a part of a solar cell. The organic electronic device may include a DA polymer with functionalized pyranopyran-derived acceptor units. The functionalized pyranopyran-derived acceptor units may include functionalized pyranopyran-dione units or functionalized naphthyridine-dione units.

Figure 12:
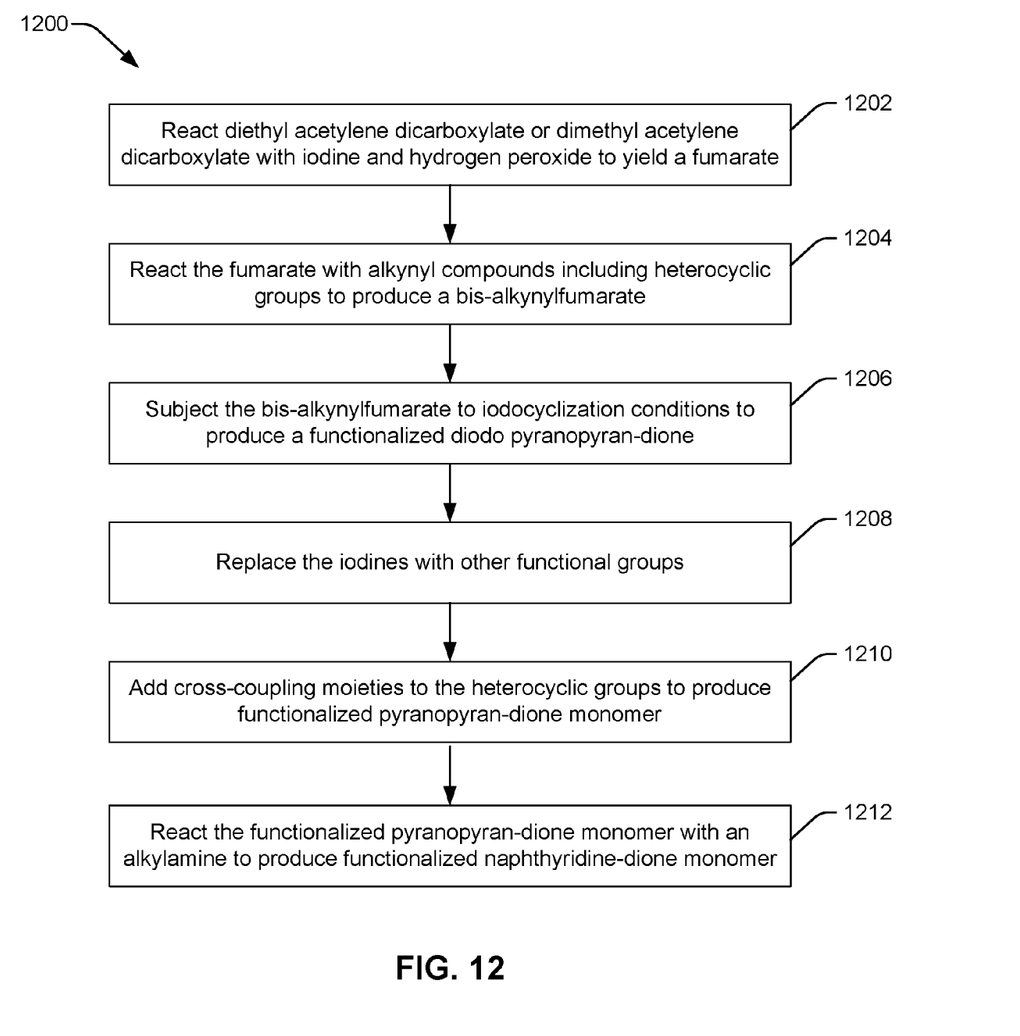
FIG. 12 depicts a method of producing functionalized pyranopyran-derived acceptors for DA polymers.

Referring to FIG. 12, a flow diagram illustrates an example of a method 1200 of producing a functionalized pyranopyran-derived acceptor for a DA polymer. The method 1200 may include reacting diethyl acetylene dicarboxylate or dimethyl acetylene dicarboxylate with iodine and hydrogen peroxide to yield a fumarate, at 1202. The diethyl acetylene dicarboxylate may be derived from a bio-renewable resource, such as succinic acid.

The fumarate may be reacted with alkynyl compounds including heterocyclic groups to produce a bis-alkynylfumarate, at 1204. The reaction may be a Sonogashira cross-coupling reaction. The heterocyclic group may be, but is not limited to, a furan, a thiophene, or a selenophene. A ring carbon of a heterocyclic group may be coupled to a protective group (e.g., $Me_3Si$). The protective group may be subsequently replaced with a cross-coupling moiety to enable polymerization with a donor monomer to produce the DA polymer.

The bis-alkynylfumarate may be subjected to iodocyclization conditions to produce a functionalized diiodopyranopyran-dione, at 1206. The iodines of the diiodopyranopyran-dione may be replaced with other functional groups, at 1208. The other functional groups may include hydrogen, halogens, linear or branched groups having from 2 to 40 carbons (e.g., alkyl groups, alkenyl groups, alkynyl groups, aryl groups, alkoxy groups, alkylamino groups, carbonyl groups, or combinations thereof).

Cross-coupling moieties may be added to the heterocyclic groups to produce functionalized pyranopyran-dione monomer, at 1210. The cross-coupling moieties may be halogens (e.g., bromine) that replace protective groups coupled to the heterocyclic groups. The resulting functionalized pyranopyran-dione monomer may include:

where X is one of oxygen, sulfur, and selenium; wherein $R_2$ is hydrogen, a halogen, or a linear or branched first group having from 2 to 40 carbons, the first group including an alkyl group, an alkenyl group, an alkynyl group, an aryl group, an alkoxy group, an alkylamino group, a carbonyl group, or combinations thereof; where $R_3$ is hydrogen or a linear or branched second group having from 1 to 40 carbons, the second group including an alkyl group, an alkenyl group, an alkynyl group, an aryl group, an alkoxy group, an alkylamino group, a carbonyl group, or combinations thereof; and where $R_4$ is hydrogen or a linear or branched third group having from 1 to 40 carbons, the third group including an alkyl group, an alkenyl group, an alkynyl group, an aryl group, an alkoxy group, an alkylamino group, a carbonyl group, or combinations thereof.

The functionalized pyranopyran-dione monomer may be reacted with an alkylamine to produce functionalized naphthyridine-dione monomer, at 1212. The functionalized naphthyridine-dione monomer may include:

where X is one of oxygen, sulfur, and selenium; wherein $R_2$ is hydrogen, a halogen, or a linear or branched first group having from 2 to 40 carbons, the first group including an alkyl group, an alkenyl group, an alkynyl group, an aryl group, an alkoxy group, an alkylamino group, a carbonyl group, or combinations thereof; where $R_3$ is hydrogen or a linear or branched second group having from 1 to 40 carbons, the second group including an alkyl group, an alkenyl group, an alkynyl group, an aryl group, an alkoxy group, an alkylamino group, a carbonyl group, or combinations thereof; where $R_4$ is hydrogen or a linear or branched third group having from 1 to 40 carbons, the third group including an alkyl group, an alkenyl group, an alkynyl group, an aryl group, an alkoxy group, an alkylamino group, a carbonyl group, or combinations thereof; and where $R_5$ is a linear or branched fourth group having from 1 to 40 carbons, the fourth group including an alkyl group, an alkenyl group, an alkynyl group, an aryl group, an alkoxy group, an alkylamino group, a carbonyl group, or combinations thereof.

Thus, FIG. 12 illustrates methods of producing functionalized pyranopyran-derived acceptor monomers which may be used in the production of DA polymers. The functionalized pyranopyran-derived acceptor monomers may include functionalized pyranopyran-dione monomers and functionalized pyranopyran-dione monomers.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein, but is to be accorded the widest scope possible consistent with the principles and features as defined by the following claims.

The invention claimed is:

1. A donor-acceptor (DA) polymer comprising:
a sequence:

wherein D is an electron-rich donor unit comprising one of

A is an electron-deficient acceptor unit, and n is an integer between 4 and 200,000, and
wherein A includes a functionalized pyranopyran-dione unit comprising:

wherein $R_1$ is a thiophene, a furan, or a selenophene; and
wherein $R_2$ is hydrogen, a halogen, or a linear or branched group having from 2 to 40 carbons selected from the group consisting of alkyl, alkenyl, alkynyl, aryl, alkoxy, alkylamino, and carbonyl.

2. The DA polymer of claim 1, wherein $R_1$ has the structure:

wherein X is sulfur, oxygen, or selenium;
wherein $R_3$ is hydrogen or a linear or branched second group having from 1 to 40 carbons selected from the group consisting of, alkyl, alkenyl, alkynyl, aryl, alkoxy, alkylamino, and carbonyl; and
wherein $R_4$ is hydrogen or a linear or branched third group having from 1 to 40 carbons selected from the group consisting of alkyl, alkenyl, alkynyl, aryl, alkoxy, alkylamino, and carbonyl.

3. The DA polymer of claim 1, wherein $R_2$ is fluorine.

4. The DA polymer of claim 1, wherein the DA polymer is polymerized from D monomers and A monomers using Stille cross coupling reactions or Suzuki cross-coupling reactions.

5. The DA polymer of claim 1, wherein the DA polymer comprises a p-type material of a solar cell.

6. An organic photovoltaic device comprising:
an anode;
a cathode; and
an active layer between the anode and the cathode,
wherein the active layer comprises a p-type material,
wherein the p-type material includes a donor-acceptor (DA) polymer, and wherein an acceptor unit of the DA polymer comprises a functionalized pyranopyran-dione compound or a functionalized naphthyridine-dione compound comprising:

wherein $R_1$ is a thiophene, a furan, or a selenophene; and
wherein $R_2$ is hydrogen, a halogen, or a linear or branched group having from 2 to 40 carbons selected from the group consisting of alkyl, alkenyl, alkynyl, aryl, alkoxy, alkylamino, and carbonyl.

7. The organic photovoltaic device of claim 6, wherein $R_1$ has the structure:

wherein X is sulfur, oxygen, or selenium;
wherein $R_3$ is hydrogen or a linear or branched second group having from 1 to 40 carbons selected from the group consisting of alkyl, alkenyl, alkynyl, aryl, alkoxy, alkylamino, and carbonyl; and
wherein $R_4$ is hydrogen or a linear or branched third group having from 1 to 40 carbons selected from the group consisting of alkyl, alkenyl, alkynyl, aryl, alkoxy, alkylamino, and carbonyl.

8. A method comprising:
reacting diethyl acetylene dicarboxylate or dimethyl acetylene dicarboxylate with iodine and hydrogen peroxide to yield a fumarate;
reacting the fumarate with one or more alkynyl compounds including thiophene, furan, or selenophene groups to produce a bis-alkynylfumarate;
subjecting the bis-alkynylfumarate to iodocyclization conditions to produce a functionalized diiodopyranopyran-dione;
replacing the iodines of the functionalized diiodopyranopyran-dione with other functional groups; and
adding cross-coupling moieties to the thiophene, furan, or selenophene groups to produce a functionalized pyranopyran-dione monomer.

9. The method of claim 8, wherein the diethyl acetylene dicarboxylate is derived from a bio-renewable resource of succinic acid.

10. The method of claim 8, wherein the cross-coupling moieties include bromine, and wherein the functionalized pyranopyran-dione monomer comprises:

wherein X is one of oxygen, sulfur, and selenium;
wherein $R_2$ is hydrogen, a halogen, or a linear or branched first group having from 2 to 40 carbons selected from the group consisting of alkyl, alkenyl, alkynyl, aryl, alkoxy, alkylamino, and carbonyl;
wherein $R_3$ is hydrogen or a linear or branched second group having from 1 to 40 carbons selected from the group consisting of alkyl, alkenyl, alkynyl, aryl, alkoxy group, alkylamino, and carbonyl; and
wherein $R_4$ is hydrogen or a linear or branched third group having from 1 to 40 carbons selected from the group consisting of alkyl, alkenyl, alkynyl, aryl, alkoxy, alkylamino, and carbonyl.

* * * * *